(12) United States Patent
Hemmer et al.

(10) Patent No.: US 9,787,321 B1
(45) Date of Patent: Oct. 10, 2017

(54) POINT CLOUD DATA COMPRESSION USING A SPACE-FILLING CURVE

(71) Applicant: Google Inc., Mountain View, CA (US)

(72) Inventors: Michael Hemmer, San Francisco, CA (US); Ondrej Stava, San Jose, CA (US)

(73) Assignee: GOOGLE INC., Mountain View, CA (US)

( * ) Notice: Subject to any disclaimer, the term of this patent is extended or adjusted under 35 U.S.C. 154(b) by 0 days.

(21) Appl. No.: 15/354,553

(22) Filed: Nov. 17, 2016

(51) Int. Cl.
*H03M 7/30* (2006.01)
*G06T 9/20* (2006.01)

(52) U.S. Cl.
CPC ............... *H03M 7/30* (2013.01); *G06T 9/20* (2013.01)

(58) Field of Classification Search
CPC ....... H03M 7/30; G06T 9/20; H04N 7/26643; H04N 7/26111
USPC ...... 341/87; 382/242, 243, 56, 235; 345/419
See application file for complete search history.

(56) References Cited

U.S. PATENT DOCUMENTS

| | | | |
|---|---|---|---|
| 6,088,035 A | 7/2000 | Sudarsky et al. | |
| 6,167,159 A | 12/2000 | Touma et al. | |
| 6,204,854 B1 | 3/2001 | Signes et al. | |
| 6,262,737 B1 | 7/2001 | Li et al. | |
| 6,525,722 B1 | 2/2003 | Deering et al. | |
| 6,532,012 B2 | 3/2003 | Deering et al. | |
| 6,563,500 B1 | 5/2003 | Seo et al. | |
| 6,879,324 B1 | 4/2005 | Hoppe et al. | |
| 7,103,211 B1 | 9/2006 | Medioni et al. | |
| 7,280,109 B2 | 10/2007 | Hoppe et al. | |
| 7,283,134 B2 | 10/2007 | Hoppe et al. | |
| 7,804,498 B1 * | 9/2010 | Graham | G06T 11/206 345/419 |
| 8,022,951 B2 | 9/2011 | Zhirkov et al. | |
| 8,217,941 B2 | 7/2012 | Park et al. | |
| 8,390,622 B2 | 3/2013 | Park et al. | |

(Continued)

FOREIGN PATENT DOCUMENTS

| | | |
|---|---|---|
| CN | 102467753 B | 10/2013 |
| CN | 102682103 B | 3/2014 |

(Continued)

OTHER PUBLICATIONS

"A Rational Parameterization of the Unit Circle", Leaves of Math, retrieved on Aug. 26, 2016 from https://mathnow.wordpress.com/2009/11/06/a-rational-Parameterization-of-the-Unit-Circle/, Nov. 6, 2009, 4 pages.

(Continued)

*Primary Examiner* — Joseph Lauture
(74) *Attorney, Agent, or Firm* — Brake Hughes Bellermann LLP (57) ABSTRACT

Techniques of data compression involve ordering the points of a point cloud according to distance along a space-filling curve. Advantageously, a space-filling curve has the property that points close in distance along the curve are close together in Euclidean space. Thus, differences between points ordered by distance along such a curve, e.g., a Hilbert curve, will be close. When the curve is fractal, i.e., self-similar at all levels, the differences will be small even when the points are very unevenly clustered throughout the point cloud. Such small differences will provide greatly improved compression to the resulting delta-encoded set of points.

20 Claims, 8 Drawing Sheets

(56) References Cited

U.S. PATENT DOCUMENTS

| | | |
|---|---|---|
| 8,619,085 B2 | 12/2013 | Keall et al. |
| 8,660,376 B2 | 2/2014 | Ahn et al. |
| 8,736,603 B2 | 5/2014 | Curington et al. |
| 8,805,097 B2 | 8/2014 | Lee et al. |
| 8,811,758 B2 | 8/2014 | Leed et al. |
| 8,884,953 B2 | 11/2014 | Teng et al. |
| 8,949,092 B2 | 2/2015 | Chen et al. |
| 9,064,311 B2 | 6/2015 | Mammou et al. |
| 9,111,333 B2 | 8/2015 | Jiang |
| 9,171,383 B2 | 10/2015 | Lee et al. |
| 9,348,860 B2 | 5/2016 | Cai et al. |
| 9,396,512 B2 | 7/2016 | Karras |
| 9,424,663 B2 | 8/2016 | Ahn et al. |
| 2004/0208382 A1 | 10/2004 | Gioia et al. |
| 2011/0010400 A1 | 1/2011 | Hayes et al. |
| 2012/0306875 A1 | 12/2012 | Cai et al. |
| 2014/0168360 A1 | 6/2014 | Ahn et al. |
| 2014/0303944 A1 | 10/2014 | Jiang et al. |
| 2016/0086353 A1 | 3/2016 | Zalik et al. |

FOREIGN PATENT DOCUMENTS

| | | | |
|---|---|---|---|
| KR | 1019990085657 A | | 12/1999 |
| KR | 1020010008944 A | | 2/2001 |
| KR | 1020030071019 A | | 9/2003 |
| KR | 100420006 B1 | | 2/2004 |
| KR | 1020040096209 A | | 11/2004 |
| KR | 1020050006322 A | | 1/2005 |
| KR | 1020050006323 A | | 1/2005 |
| KR | 1020060087631 A | | 8/2006 |
| KR | 1020060087647 A | | 8/2006 |
| KR | 1020060087662 A | | 8/2006 |
| KR | 1020060088136 A | | 8/2006 |
| KR | 1020080066216 A | | 7/2008 |
| KR | 1020090025672 A | | 3/2009 |
| KR | 1020090097057 A | | 9/2009 |
| KR | 100927601 B1 | | 11/2009 |
| KR | 1020100007685 A | | 1/2010 |
| KR | 20100012724 A | | 2/2010 |
| KR | 20100112848 A | | 10/2010 |
| WO | 00/45237 A1 | | 8/2000 |
| WO | 2010111097 A1 | | 9/2010 |

OTHER PUBLICATIONS

Alliez, et al., "Progressive compression for lossless transmission of triangle meshes", Proceedings of the 28th annual conference on Computer graphics and interactive techniques, 2001, 8 pages.

Isenburg, "Compression and Streaming of Polygon Meshes", dissertation, retrieved from http://cs.unc.edu/newspublications/doctoral-dissertations/abstracts-a-I/#Isenburg, 2005, 217 pages.

Narkowicz, "Octahedron normal vector encoding", retrieved on Aug. 26, 2016 from https://knarkowicz.wordpress.com/2014/04/16/octahedron-normal-vector-encoding/, Apr. 16, 2014, 9 pages.

Schnabel, "Octree-based Point-Cloud Compression", Eurographics Symposium on Point-Based Graphics, 2006, 11 pages.

"Entropy encoding", Wikipedia, the free encyclopedia, retrieved from https://en.wikipedia.org/wiki/Entropy_encoding, Apr. 11, 2016, 1 page.

"Quantization", Wikipedia, the free encyclopedia, retrieved from https://en.wikipedia.org/wiki/Quantization, Apr. 11, 2016, 1 page.

Gandoin, et al., "Progressive lossless compression of arbitrary simplicial complexes", ACM Transactions on Graphics (TOG), Jul. 23, 2002, pp. 372-379.

Gumhold, et al., "Predictive point-cloud compression", ACM SIGGRAPH 2005 Sketches, Jul. 31, 2005, 1 page.

Huang, et al., "Octree-Based Progressive Geometry Coding of Point Clouds", SPBG Jul. 2006: 103110, Jul. 29, 2006, pp. 103-110.

Merry, et al., "Compression of dense and regular point clouds", Computer Graphics Forum, Dec. 1, 2006, pp. 709-716.

Waschbüsch, et al., "Progressive compression of point-sampled models", Eurographics symposium on point-based graphics, Jun. 2, 2004, pp. 95-102.

\* cited by examiner

POINT CLOUD DATA COMPRESSION USING A SPACE-FILLING CURVE

TECHNICAL FIELD

This description relates to data compression.

BACKGROUND

A point cloud can be, or can include, a set of data that represent, for example, an object. The amount of data in a point cloud can be large, and transmission and storage of a large point cloud can use significant computing and/or communications resources.

SUMMARY

In one general aspect, a computer-implemented method can include identifying, by controlling circuitry of a computer, portions of a space-filling curve with a plurality of points in space. The method can also include defining, by the controlling circuitry, a sequence for encoding the plurality of points in space according to positions of each of the plurality of points along the space-filling curve. The method can further include generating, by the controlling circuitry, an encoding of the plurality of points as arranged in the sequence.

The details of one or more implementations are set forth in the accompanying drawings and the description below. Other features will be apparent from the description and drawings, and from the claims.

DETAILED DESCRIPTION

One typically compresses the discrete data prior to storage of the data in a computer. One way of effecting the compression is to perform a delta encoding between points of the point cloud.

Conventional approaches to performing the delta encoding result in a stream of delta values that are unable to be compressed very well. For example, a nearest neighbor approach may result in many jumps through a discrete set of points. Such jumps produce many variations in the delta values. Such variations in the delta values result in poor compression of those values.

In accordance with the implementations described herein and in contrast with the above-described conventional techniques of data compression, improved techniques involve ordering the points of a point cloud according to distance along a space-filling curve. Advantageously, a space-filling curve has the property that points close in distance along the curve are close together in Euclidean space. Thus, differences between points ordered by distance along such a curve, e.g., a Hilbert curve, will be close. When the curve is fractal, i.e., self-similar at all levels, the differences will be small even when the points are very unevenly clustered throughout the point cloud. Such small differences will provide greatly improved compression to the resulting delta-encoded set of points.

Figure 1:
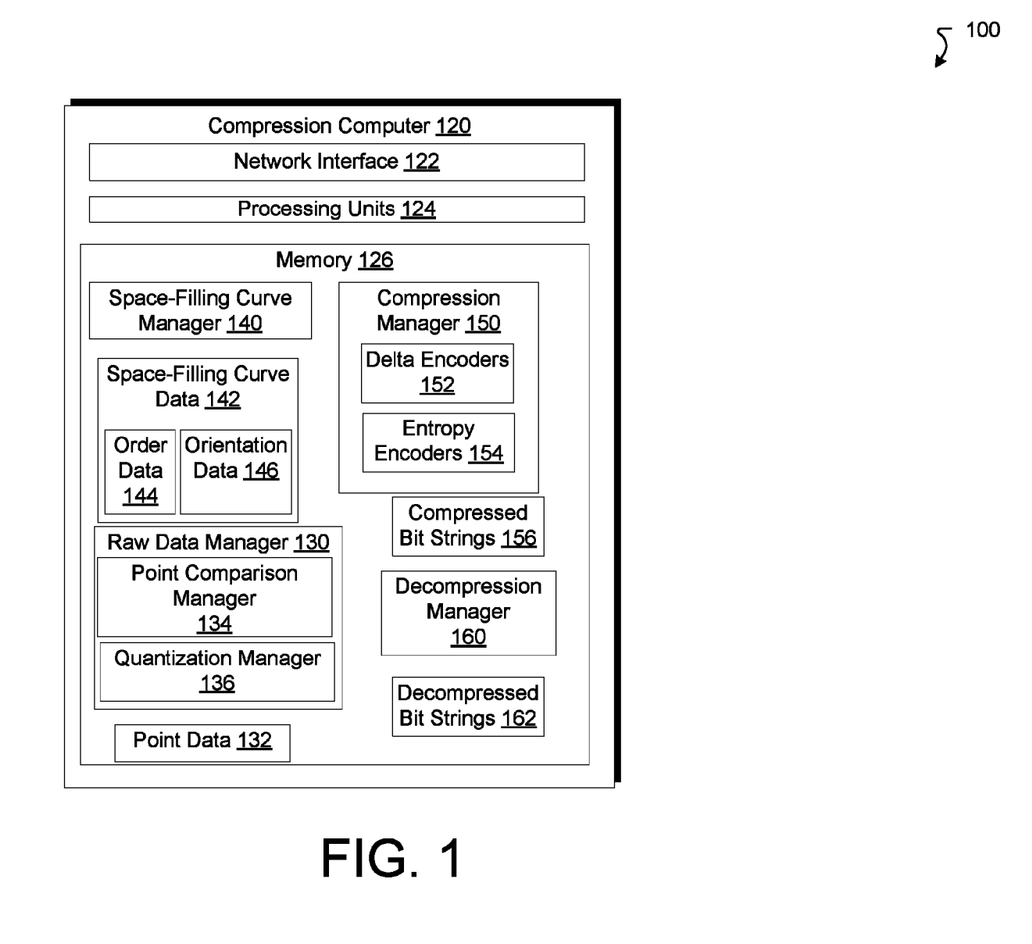
FIG. 1 is a diagram that illustrates an example electronic environment in which improved techniques described herein may be implemented.

FIG. 1 is a diagram that illustrates an example electronic environment 100 in which the above-described improved techniques may be implemented. As shown, in FIG. 1, the electronic environment 100 includes a compression computer 120.

The compression computer 120 is configured to receive points of a point cloud, perform compression operations to reduce the burden of storing the points, and perform decompression operations to recover the point cloud. Specifically, the compression computer 120 is configured to arrange the points, prior to compression, in a one-dimensional list in an order according to a space-filling curve.

The compression computer 120 includes a network interface 122, one or more processing units 124, and memory 126. The network interface 122 includes, for example, Ethernet adaptors, Token Ring adaptors, and the like, for converting electronic and/or optical signals received from the network 170 to electronic form for use by the point cloud compression computer 120. The set of processing units 124 include one or more processing chips and/or assemblies. The memory 126 includes both volatile memory (e.g., RAM) and non-volatile memory, such as one or more ROMs, disk drives, solid state drives, and the like. The set of processing units 124 and the memory 126 together form control circuitry, which is configured and arranged to carry out various methods and functions as described herein.

In some embodiments, one or more of the components of the compression computer 120 can be, or can include processors (e.g., processing units 124) configured to process instructions stored in the memory 126. Examples of such instructions as depicted in FIG. 1 include a raw data manager 130 that includes a point comparison 134 and a quantization manager 136, a space-filling curve manager 140, a compression manager 150, and a decompression manager 160. Further, as illustrated in FIG. 1, the memory 126 is configured to store various data, which is described with respect to the respective managers that use such data.

The raw data manager 130 is configured to receive and store, as data 132, coordinates of points of a point cloud. The data 132 may consume a large amount of storage. Accordingly, in some implementations, these data 132 are stored in compressed form in non-volatile storage media such as a magnetic disk drive, a solid-state drive, and the like. Nevertheless, prior to such storage, the raw data manager 130 is configured to express the data 132 in such a way as to increase the efficiency of the compression of the data 132. Along these lines, the raw data manager 130 includes a point comparison manager 134 and a quantization manager 136.

The data 132 are coordinates that are bounded from above and below. These bounds are referred to as a bounding box.

The point comparison manager 134 is configured to compare two points at a time to determine which order in a sequence the two points should appear. Such a comparison may be performed in parallel and/or be cache oblivious. In some implementations, the point comparison manager 134 effects such a comparison by locating the place in two bit strings at which there is a difference between the bits. In other implementations, the point comparison manager 134 effects the comparison by subdividing a bounding box within which all of the data 132 is contained so that each point is isolated within its own unique subdivision. For example, suppose that the point cloud contains points in two dimensions located within a square. In this case, the point comparison manager 134 may begin by subdividing the bounding box in four equal divisions: in half along a first axis, and in half along a second axis. The point comparison manager 134 independently subdivides each subdivision in a similar fashion, into four equal divisions, until each subdivision has a single point.

Along these lines, the quantization manager 136 assigns a bit string to each subdivision and accordingly each point. For example, suppose that, in the above-described subdivisions, the smallest subdivision has a side length that is ⅛ of the side length of the bounding box, i.e., there have been three subdivisions performed to isolate each point in its own unique subdivision. In this case, each subdivision may be assigned a pair of bit strings, each having three bits. In some implementations, the raw data manager 130 is configured to replace the point data 132 with the bit strings representing the subdivisions into which each of the points are isolated. In other implementations, the raw data manager 130 stores the bit strings in a new temporary location in memory.

In some implementations, when the comparison is effected using subdivisions, the point comparison manager 134 performs the subdivisions adaptively. For example, suppose that the points of the point cloud are distributed in uneven clusters throughout the bounding box. Along these lines, suppose further that, after a first subdivision, there is only one point in a first subdivision, no points in a second subdivision, three points in a third subdivision, and two points in a fourth subdivision. It then follows that no further subdividing is necessary in the first and second subdivisions. Accordingly, only the third and fourth subdivisions require further subdividing.

The space filling curve manager 140 is configured to arrange the above-derived bit strings generated by the raw data manager 130 in a sequence according to a space-filling curve 142. A space-filling curve 142 is a curve that traverses each subdivision exactly once. While there are many examples of space-filling curves 142 (e.g., Peano curve, Osgood curve) by which a sequence of bit strings may be defined, it turns out that fractal curves that have a self-similarity property produce sequences that result in better compression. While there are several examples of fractal curves (e.g., Dragon curve, Sierpinski curve), a Hilbert curve provides a simple example of a space-filling, fractal curve that passes through each subdivision exactly once. Further, the Hilbert curve has the property that points on the curve that are small distance apart along the curve are also close together in Euclidean space.

The Hilbert curve 142 may be defined recursively within a subdivided bounding box. For example, a Hilbert curve 142 that traverses exactly once through each subdivision of the bounding box that has been subdivided n times is said to have an order n. The order n+1 Hilbert curve 142 may be obtained by making four copies of the curve, two of which are positioned as is within each of the top two subdivisions, one of which is rotated by −90 degrees and is placed in the lower left subdivision, and one of which is rotated by +90 degrees and is placed in the lower right subdivision. Illustrations of the Hilbert curve may be found in FIGS. 3A, 3B, and 3C.

In some implementations, the subdivisions of the bounding box are adaptive as described above. In this case, the order of the Hilbert curve over the bounding box is nonuniform and varies with the length of a subdivision. Accordingly, the subdivision data may be expressed in the order data 144 of the Hilbert curve 142. The location of a subdivision with respect to the distance along the Hilbert curve may be determined through the order data 144 as well as orientation data 146, which specifies for each subdivision whether the portion of the curve 142 there is rotated by 0, −90, or +90 degrees.

Thus, given the order data 144 and the orientation data 146 of the Hilbert curve 142, the space-filling curve manager 140 in implementations such as that described above is configured to arrange the quantized point data 132, i.e. the bit strings representing the subdivisions containing a unique point of the point cloud, in a sequence by distance along the Hilbert curve 142.

The compression manager 150 is configured to apply an encoding scheme to compress the sequenced bit strings into compressed bit strings 156. As depicted in FIG. 1, the compression manager 150 uses a delta encoder 152 to perform the compression on the sequence of arranged bit strings. An advantage of arranging the bit strings in the manner described above is that there is typically a very low amount of variation in the differenced, or delta, sequence of bit strings. Such a low variation provides an excellent compression ratio upon compression by an entropy encoder 154, e.g., a Huffman encoder, an arithmetic encoder, or the like.

The decompression manager 160 is configured to apply a decoding scheme to decompress the compressed bit strings 156 to produce decompressed bit strings 162. If the decompression scheme functions properly, then the decompressed bit strings 162 produces the sequenced differences provided by the delta encoder 152. These differences may be added back to an initial point on the Hilbert curve to reproduce the quantized bit strings.

In some implementations, the memory 126 can be any type of memory such as a random-access memory, a disk drive memory, flash memory, and/or so forth. In some implementations, the memory 126 can be implemented as more than one memory component (e.g., more than one RAM component or disk drive memory) associated with the components of the user device 120. In some implementations, the memory 126 can be a database memory. In some implementations, the memory 126 can be, or can include, a non-local memory. For example, the memory 126 can be, or can include, a memory shared by multiple devices (not shown). In some implementations, the memory 126 can be associated with a server device (not shown) within a network and configured to serve the components of the user device 120.

The components (e.g., modules, processing units 124) of the compression computer 120 can be configured to operate based on one or more platforms (e.g., one or more similar or different platforms) that can include one or more types of hardware, software, firmware, operating systems, runtime libraries, and/or so forth. In some implementations, the components of the compression computer 120 can be configured to operate within a cluster of devices (e.g., a server farm). In such an implementation, the functionality and processing of the components of the compression computer 120 can be distributed to several devices of the cluster of devices.

The components of the compression computer 120 can be, or can include, any type of hardware and/or software configured to process attributes. In some implementations, one or more portions of the components shown in the components of the compression computer 120 in FIG. 1 can be, or can include, a hardware-based module (e.g., a digital signal processor (DSP), a field programmable gate array (FPGA), a memory), a firmware module, and/or a software-based module (e.g., a module of computer code, a set of computer-readable instructions that can be executed at a computer). For example, in some implementations, one or more portions of the components of the compression computer 120 can be, or can include, a software module configured for execution by at least one processor (not shown). In some implementations, the functionality of the components can be included in different modules and/or different components than those shown in FIG. 1.

Although not shown, in some implementations, the components of the compression computer 120 (or portions thereof) can be configured to operate within, for example, a data center (e.g., a cloud computing environment), a computer system, one or more server/host devices, and/or so forth. In some implementations, the components of the compression computer 120 (or portions thereof) can be configured to operate within a network. Thus, the components of the compression computer 120 (or portions thereof) can be configured to function within various types of network environments that can include one or more devices and/or one or more server devices. For example, the network can be, or can include, a local area network (LAN), a wide area network (WAN), and/or so forth. The network can be, or can include, a wireless network and/or wireless network implemented using, for example, gateway devices, bridges, switches, and/or so forth. The network can include one or more segments and/or can have portions based on various protocols such as Internet Protocol (IP) and/or a proprietary protocol. The network can include at least a portion of the Internet.

In some embodiments, one or more of the components of the compression computer 120 can be, or can include, processors configured to process instructions stored in a memory. For example, the raw data manager 130 (and/or a portion thereof), the space-filling curve manager 140 (and/or a portion thereof), the compression manager 150 (and/or a portion thereof), and the decompression manager 160 (and/or a portion thereof) can be a combination of a processor and a memory configured to execute instructions related to a process to implement one or more functions.

Figure 2:
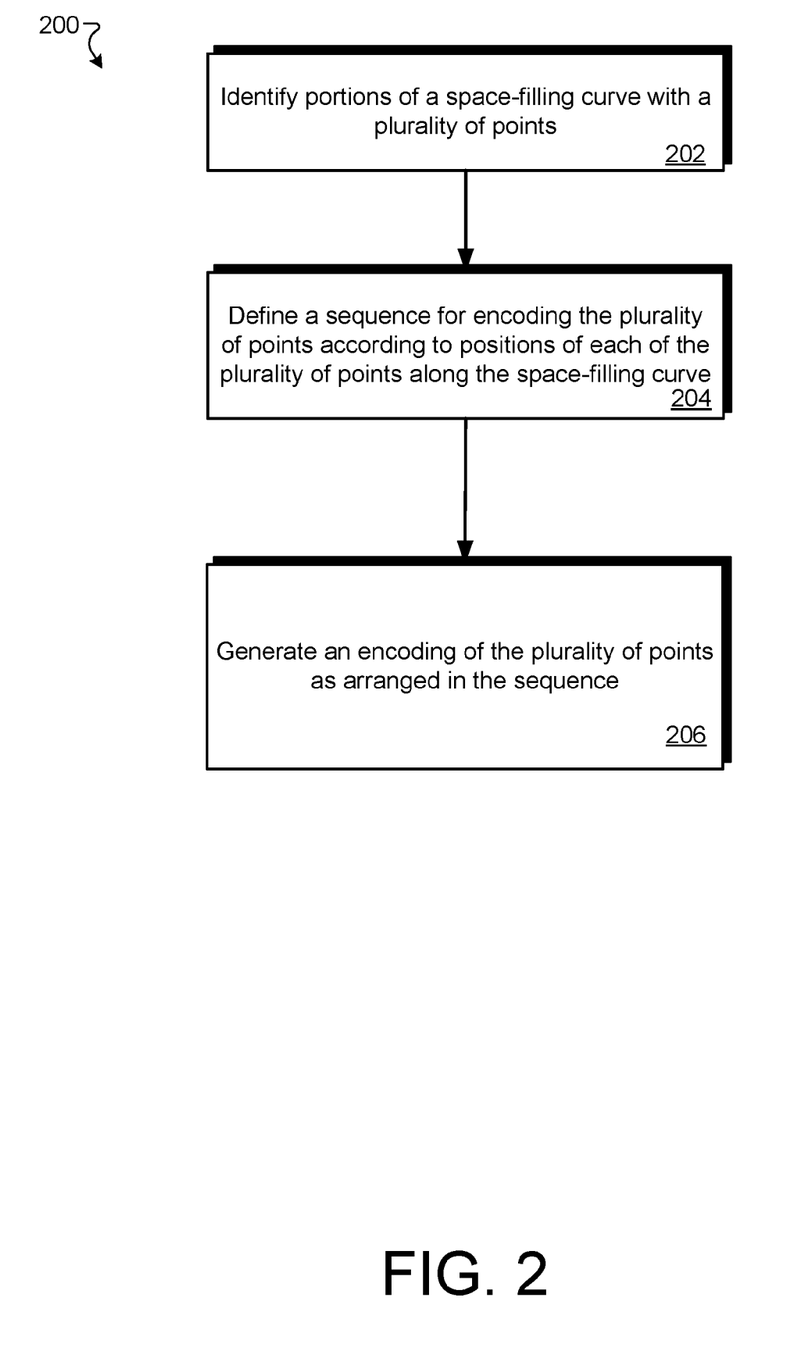
FIG. 2 is a flow chart that illustrates an example method of implementing the improved techniques shown in FIG. 1.

FIG. 2 is a flow chart that illustrates an example method 200 of compressing a point cloud shown in FIG. 1. The method 200 may be performed by software constructs described in connection with FIG. 1, which reside in memory 126 of the compression computer 120 and are run by the set of processing units 124.

At 202, the compression computer 120 identifies a portion of a space-filling curve with a first point of the plurality of points in space. For example, for a given bit string, the space-filling curve manager 140 associates an order of a Hilbert curve from the order data 144 and an orientation of the Hilbert curve from the orientation data 146 with the bit string.

At 204, the compression computer 120 defines a sequence for encoding the first point and each of the other points of the plurality of points in space according to positions of the first point and that point along the space-filling curve. For example, when a second subdivision containing the second point comes after a first subdivision containing the first point along the curve, then the second point (i.e., second bit string after quantization) is arranged after the first point (i.e., first bit string after quantization) in the sequence. If the second subdivision is adjacent to the first subdivision along the curve, then the second point comes after the first point in the sequence. If not, then there may be other bit strings in between the first bit string and the second bit string in the sequence.

At 206, the compression computer 120 generates an encoding of the first point and each of the other points of the plurality of points as arranged in the sequence. For example, the encoding manager 150 generates a difference sequence based on differences of consecutive elements of the sequence for encoding. The encoding manager 150 may then apply an entropy encoder to the difference sequence.

Figure 3:
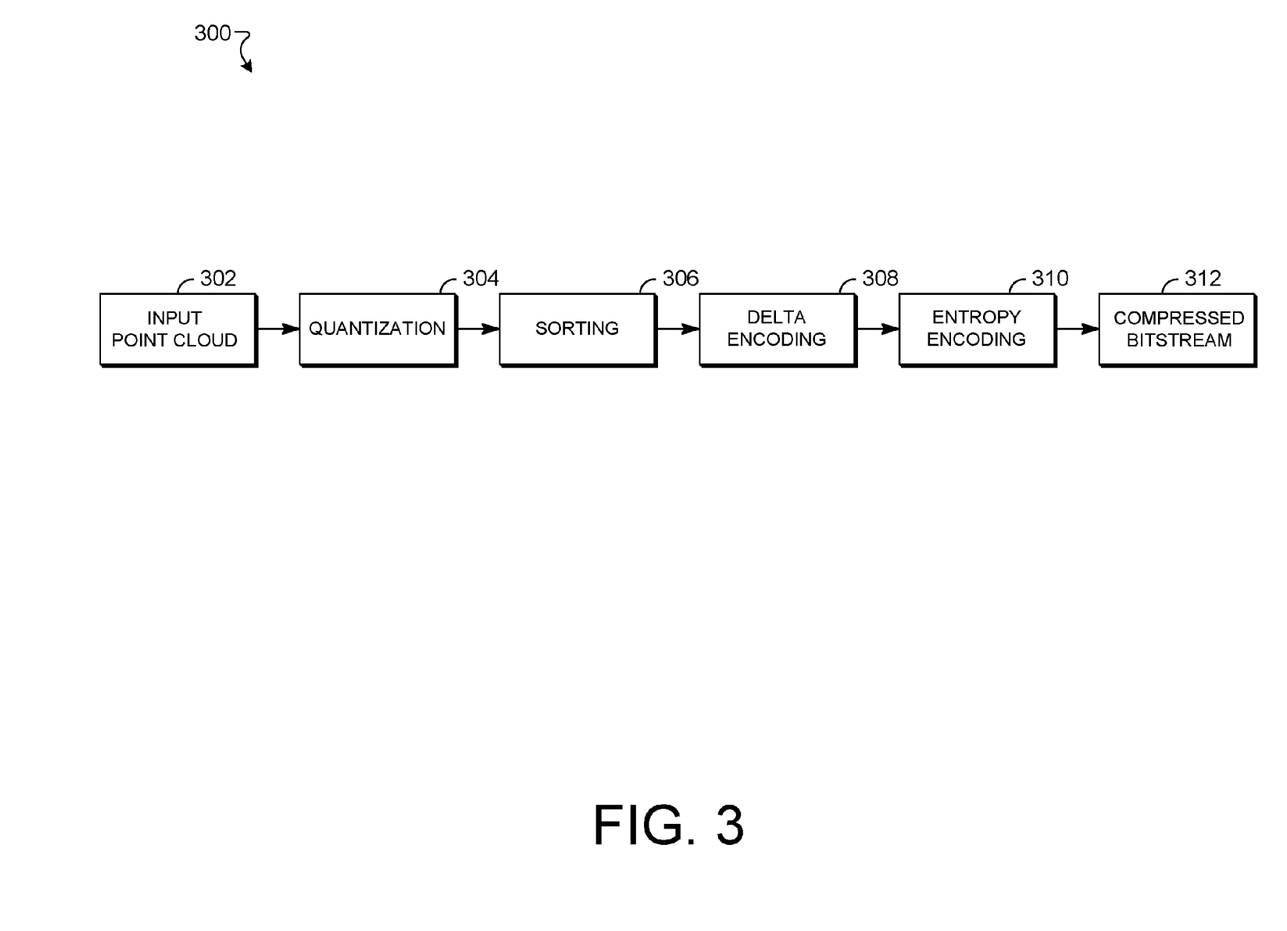
FIG. 3 is a flow chart that illustrates an example encoding process according to the improved techniques shown in FIG. 1.

FIG. 3 is a block diagram of an example process 300 according to the improved techniques described herein. The process 300 can be implemented, as described above, such as by providing a computer software program stored in memory, for example, the memory 126. In other implementations, the process 300 may be implemented using specialized hardware included in, for example, the compression computer 120.

The process 300 includes the following stages to perform the various functions in a forward path (shown by the solid connection lines) to produce an encoded or compressed bitstream 312 using an input point cloud 302: a quantization stage 304, a sorting stage 306, a delta encoding stage 308, and an entropy encoding stage 310. Other structural variations of the encoder 300 can be used to encode a point cloud.

When the point cloud 302 is presented for encoding, the raw data manager 130 processes the point cloud 302 as a set of data points 132. The quantization stage 304, executed by the quantization manager 136, can include converting the values of the data points 132 (which may be received in float, double, or some other non-integer format) into integer form based on a subdivision of a bounding box containing all of the data points 132 such that each data point 132 is associated with its own unique subdivision. The sorting stage 306 can include sorting the quantized data points along a space-filling curve, for example, a Hilbert curve, so as to identify an ordering of the data points for processing at the delta encoding stage 308. The delta encoding stage 308 can use the sorted data points to determine difference vectors indicative of the differences between the values for sets of two data points (e.g., the first and second data points sorted along the space-filling curve). The entropy encoding stage 310 can use an entropy coding scheme to encode the coordinates of the difference vectors to a data sequence.

Although the above example involves encoding coordinates of a point cloud, this does not have to be the case. Along these lines, in other implementations, the data to be encoded as described above can take the form of color coordinates, intensity/irradiance values, timestamps, and the like.

Further, in some implementations there is no quantization stage. Rather, in such implementations, the coordinates of the points are represented as floating-point numbers.

Figure 4A:
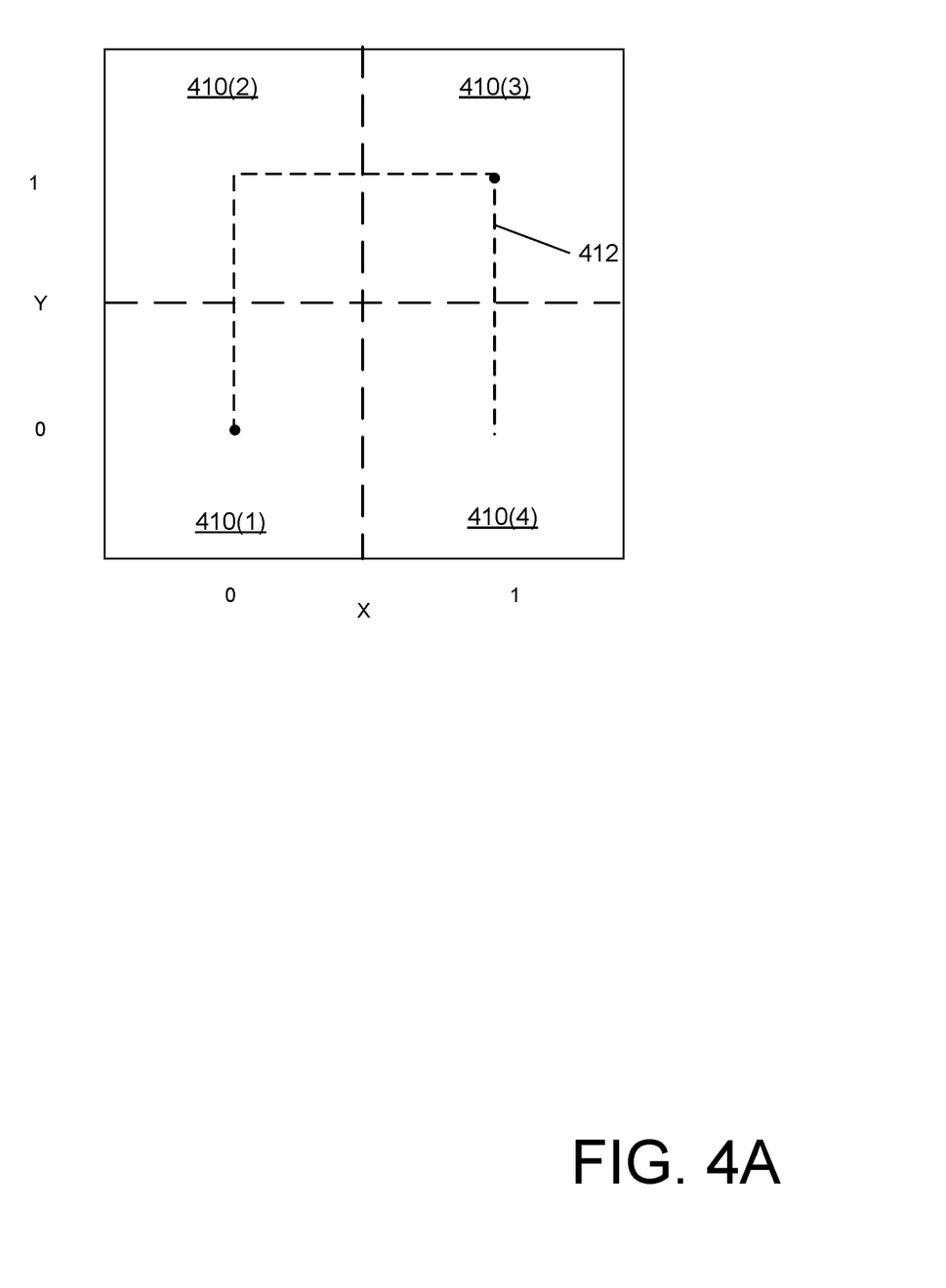
FIG. 4A is a diagram that illustrates an example space-filling curve used in the process shown in FIG. 3.
Figure 4B:
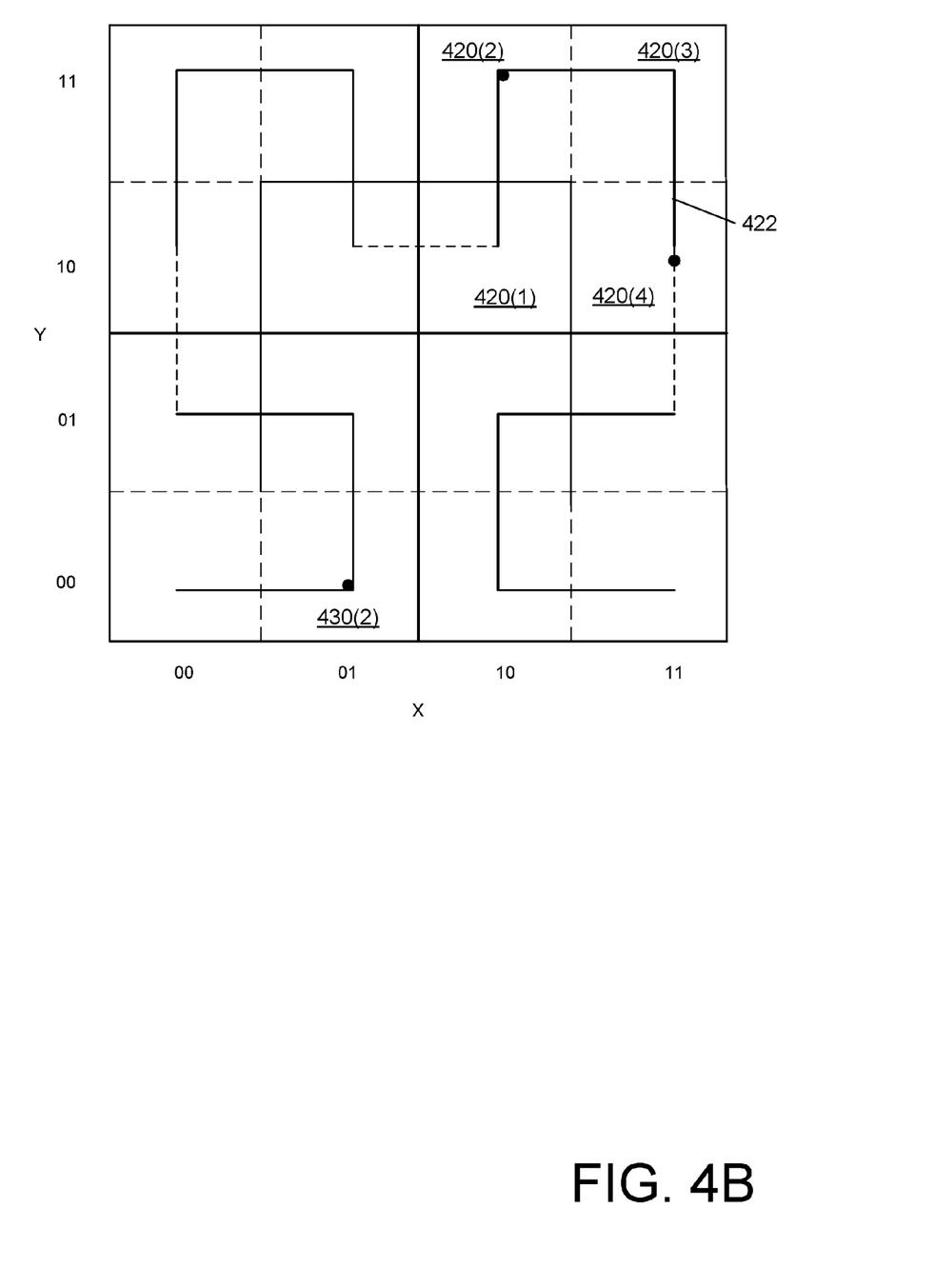
FIG. 4B is a diagram that illustrates another example space-filling curve used in the process shown in FIG. 3.
Figure 4C:
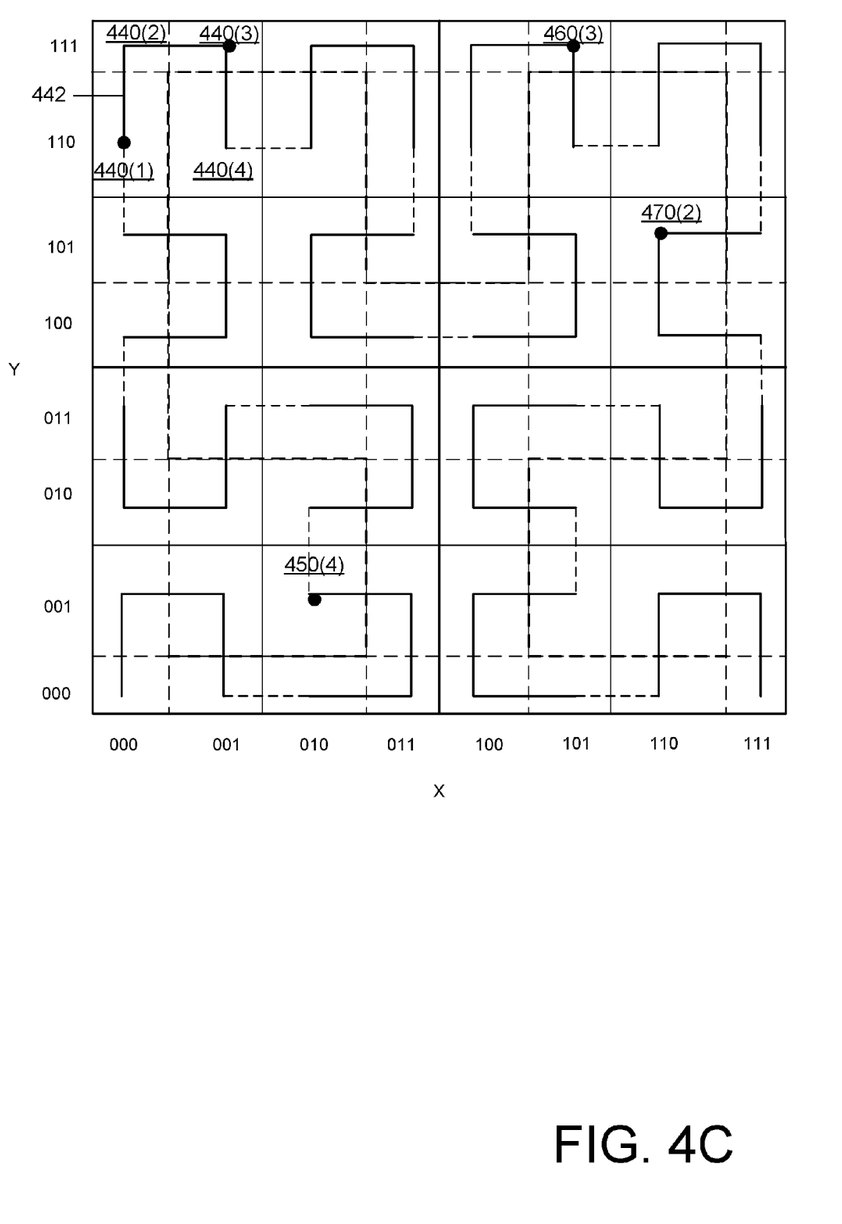
FIG. 4C is a diagram that illustrates another example space-filling curve used in the process shown in FIG. 3.

FIGS. 4A, 4B, and 4C illustrate various Hilbert curves for different levels of subdivision. The diagrams illustrate how the Hilbert curves are used to order points in a plane. Nevertheless, in many implementations, the point clouds are in three or more dimensions; in such cases, three-or-more-dimensional Hilbert curves, analogous to the two-dimensional curves, may be used to sequence the subdivisions and therefore the bit strings that are the coordinates of those subdivisions.

FIG. 4A is a diagram that illustrates an example space-filling curve of order one used in the process 300 shown in FIG. 3. In this case, a point cloud has only two points within a bounding box. The bounding box is subdivided in each direction once. A corresponding Hilbert curve 412 for these subdivisions 410(1), 410(2), 410(3), and 410(4) is illustrated. In this case, the Hilbert curve makes an upside-down "U" shape as it traverses exactly once through each subdivision.

One of the points of the point cloud has coordinates (0,0) and lies in the subdivision 410(1), while the other point has coordinates (1,1) and lies in the subdivision 410(3). The Hilbert curve traverses the subdivisions beginning at the subdivision 410(1) and ending at the subdivision 410(4). Accordingly, the sequence of bit strings in this case is (0,0), (1,1).

FIG. 4B is a diagram that illustrates another example space-filling curve of order two used in the process 300. In this case, there is another point in the subdivision 410(3). Accordingly, the point comparison manager 134 may divide this subdivision into four further subdivisions 420(1), 420(2), 420(3), and 420(4). As illustrated in FIG. 4B, one point is in subdivision 420(2) with coordinates (10,11) and the other is in subdivision 420(4) with coordinates (11,10).

In the example illustrated in FIG. 4B, each of the rest of the other subdivisions 410(1), 410(2), and 410(3) is also divided into four further subdivisions. For example, the point shown in FIG. 4A in subdivision 410(1) is now in subdivision 430(2) with coordinates (01,00). In other implementations, however, only the original subdivision 410(3) would undergo further subdivision.

A Hilbert curve of order two may be generated from the curve of order one as follows. In subdivisions 420(2) and 420(3), the curve 412 is copied into each subdivision as portions of the order two curve in each of those subdivisions. In the subdivision 420(1), the curve 412 is copied into the subdivision and rotated by −90 degrees as the portion of the order two curve in that subdivision. In the subdivision 420(4), the curve 412 is copied into the subdivision and rotated by +90 degrees as the portion of the order two curve in that subdivision. To form a continuous curve, the ends of each of these portions may be joined with beginnings of adjacent portions; these joinings are shown as dashed lines in FIG. 4B.

The space-filling curve manager 140 identifies a portion 422 of the Hilbert curve with a point or subdivision, e.g., subdivision 420(2). This portion is of order two (corresponding to a second subdivision of the bounding box) and is oriented with zero degrees rotation with respect to the order one Hilbert curve. Based on that information, the space-filling curve manager arranges the bit strings in the ordered sequence (01,00), (10,11), (11,10).

FIG. 4C is a diagram that illustrates an example space-filling curve of order three used in the process 300 shown in FIG. 3. In this case, there is another point in the subdivision 420(2). Accordingly, the point comparison 134 may divide this subdivision into four further subdivisions 440(1), 440(2), 440(3), and 440(4). As illustrated in FIG. 4C, one point is in subdivision 440(1) with coordinates (000,110) and the other is in subdivision 440(3) with coordinates (001,111).

In the example illustrated in FIG. 4C, each of the rest of the other subdivisions 420(1), 420(3), and 420(4) is also divided into four further subdivisions. For example, the point shown in FIG. 4B in subdivision 420(4) is now in subdivision 450(2) with coordinates (010,001). The point in subdivision 430(2) is now in 460(3). The point in 420(4) is now in 470(2). In other implementations, however, only the original subdivision 410(3) would undergo further subdivision.

A Hilbert curve of order three may be generated from the curve of order two as follows. The entire curve of order two is copied into subdivisions 420(2) and 420(3) so that a copy of the curve of order two is a portion of the order three curve in each of those subdivisions. In the subdivision 420(1), the curve of order two is copied into that subdivision and rotated by −90 degrees as the portion of the order three curve in that subdivision. In the subdivision 420(4), the curve of order two is copied into that subdivision and rotated by +90 degrees as the portion of the order three curve in that subdivision. To form a continuous curve, the ends of each of these portions may be joined with beginnings of adjacent portions; these joinings are shown as dashed lines in FIG. 4C.

The space-filling curve manager 140 identifies a portion 442 of the Hilbert curve with a point or subdivision, e.g., subdivision 440(1). This portion is of order three (corresponding to a three subdivision of the bounding box) and is oriented with zero degrees rotation with respect to the order one Hilbert curve. Based on that information, the space-filling curve manager arranges the bit strings in the ordered sequence (010,001), (010,110), (001,111), (101,111), (110, 101).

Once the sequence of bit strings has been identified, the compression manager 150 then performs a compression operation on the sequence. First, the compression manager 150 performs a delta encoding on the sequence to produce a delta sequence. Then the compression manager 150 performs an entropy encoding on the delta sequence to produce a compressed delta sequence. When the sequence of bit strings is arranged according to the Hilbert curve, the compressed delta sequence takes up relatively little storage space because the delta sequence typically has very little variation.

Figure 5:
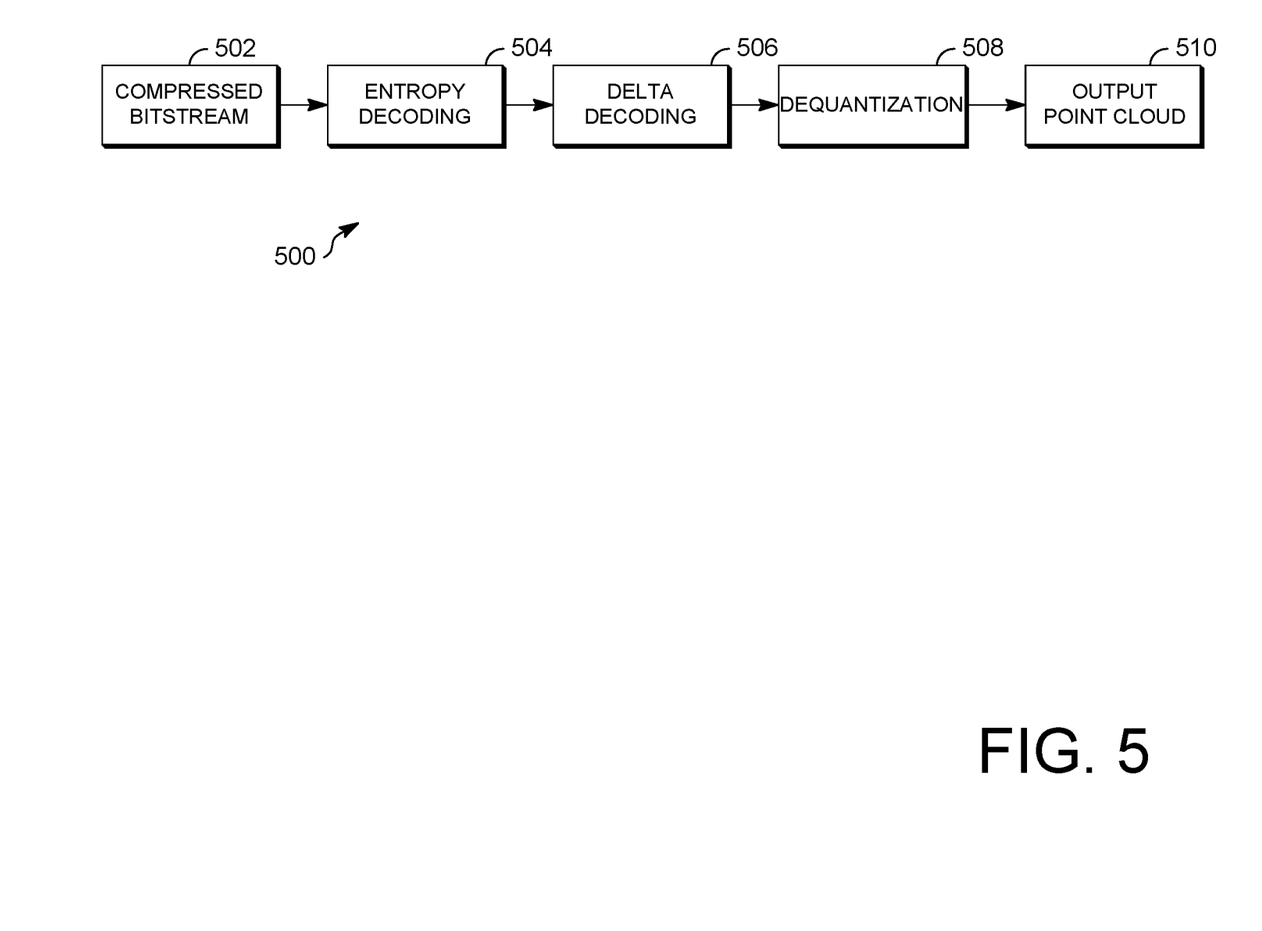
FIG. 5 is a flow chart that illustrates an example process of decompressing data and recovering the points of the raw data shown in FIG. 1.

FIG. 5 illustrates an example decompression process 500. When the compressed delta sequence 502 is presented for decoding, the delta sequence within the compressed delta sequence 502 can be entropy decoded at the entropy decoding stage 504 to result in the delta sequence. The delta decoding stage 506 can include using a starting data point and the decoded delta sequence to produce the quantized bit strings. In some implementations, a dequantization stage 508 can include dequantizing the unsorted data points from an integer form into a float, double, or other form in which the data points were received or otherwise identified before quantization stage 304 in the encoding process 300. The result of either the dequantization stage 508 or the delta decoding stage 506 is output as the output point cloud 510.

When the dequantization stage 508 is not used, the decoding process 500 may advantageously be independent of the original point cloud. In this case, the decoding process 500 may act on the compressed delta sequence without any further information.

Figure 6:
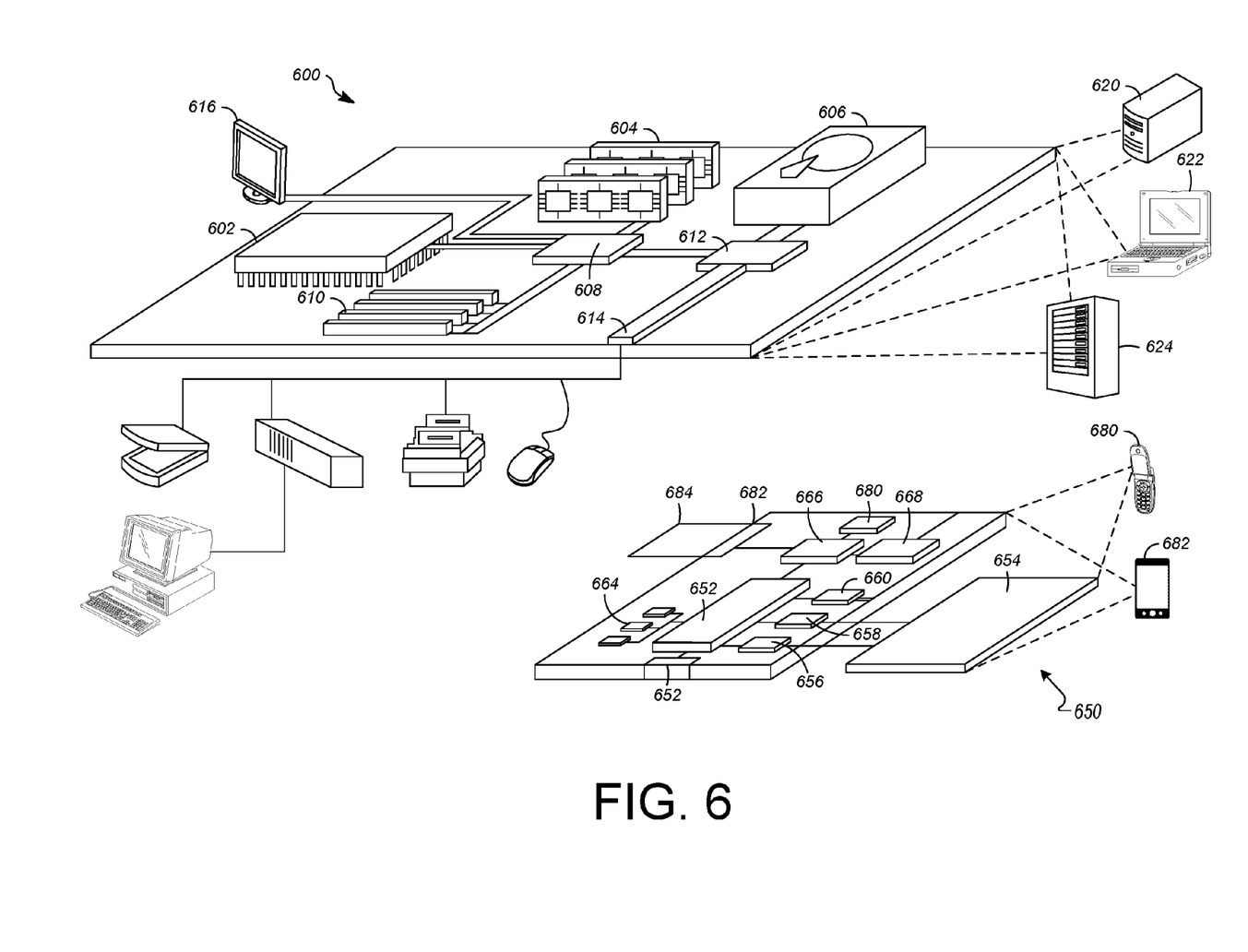
FIG. 6 illustrates an example of a computer device and a mobile computer device that can be used with circuits described here.

FIG. 6 illustrates an example of a generic computer device 600 and a generic mobile computer device 650, which may be used with the techniques described here.

As shown in FIG. 6, computing device 600 is intended to represent various forms of digital computers, such as laptops, desktops, workstations, personal digital assistants, servers, blade servers, mainframes, and other appropriate computers. Computing device 650 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 600 includes a processor 602, memory 604, a storage device 606, a high-speed interface 608 connecting to memory 604 and high-speed expansion ports 610, and a low speed interface 612 connecting to low speed bus 614 and storage device 606. Each of the components 602, 604, 606, 608, 610, and 612, are interconnected using various busses, and may be mounted on a common motherboard or in other manners as appropriate. The processor 602 can process instructions for execution within the computing device 600, including instructions stored in the memory 604 or on the storage device 606 to display graphical information for a GUI on an external input/output device, such as display 616 coupled to high speed interface 608. In other implementations, multiple processors and/or multiple buses may be used, as appropriate, along with multiple memories and types of memory. Also, multiple computing devices 600 may be connected, with each device providing portions of the necessary operations (e.g., as a server bank, a group of blade servers, or a multi-processor system).

The memory 604 stores information within the computing device 600. In one implementation, the memory 604 is a volatile memory unit or units. In another implementation, the memory 604 is a non-volatile memory unit or units. The memory 604 may also be another form of computer-readable medium, such as a magnetic or optical disk.

The storage device 606 is capable of providing mass storage for the computing device 600. In one implementation, the storage device 606 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 604, the storage device 606, or memory on processor 602.

The high speed controller 608 manages bandwidth-intensive operations for the computing device 500, while the low speed controller 612 manages lower bandwidth-intensive operations. Such allocation of functions is exemplary only. In one implementation, the high-speed controller 608 is coupled to memory 604, display 616 (e.g., through a graphics processor or accelerator), and to high-speed expansion ports 610, which may accept various expansion cards (not shown). In the implementation, low-speed controller 612 is coupled to storage device 506 and low-speed expansion port 614. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 600 may be implemented in a number of different forms, as shown in the figure. For example, it may be implemented as a standard server 620, or multiple times in a group of such servers. It may also be implemented as part of a rack server system 624. In addition, it may be implemented in a personal computer such as a laptop computer 622. Alternatively, components from computing device 600 may be combined with other components in a mobile device (not shown), such as device 650. Each of such devices may contain one or more of computing device 600, 650, and an entire system may be made up of multiple computing devices 600, 650 communicating with each other.

Computing device 650 includes a processor 652, memory 664, an input/output device such as a display 654, a communication interface 666, and a transceiver 668, among other components. The device 650 may also be provided with a storage device, such as a microdrive or other device, to provide additional storage. Each of the components 650, 652, 664, 654, 666, and 668, are interconnected using various buses, and several of the components may be mounted on a common motherboard or in other manners as appropriate.

The processor 652 can execute instructions within the computing device 650, including instructions stored in the memory 664. The processor may be implemented as a chipset of chips that include separate and multiple analog and digital processors. The processor may provide, for example, for coordination of the other components of the device 650, such as control of user interfaces, applications run by device 650, and wireless communication by device 650.

Processor 652 may communicate with a user through control interface 658 and display interface 656 coupled to a display 654. The display 654 may be, for example, a TFT LCD (Thin-Film-Transistor Liquid Crystal Display) or an OLED (Organic Light Emitting Diode) display, or other appropriate display technology. The display interface 656 may comprise appropriate circuitry for driving the display 654 to present graphical and other information to a user. The control interface 658 may receive commands from a user and convert them for submission to the processor 652. In addition, an external interface 662 may be provided in communication with processor 652, so as to enable near area communication of device 650 with other devices. External interface 662 may provide, for example, for wired communication in some implementations, or for wireless communication in other implementations, and multiple interfaces may also be used.

The memory 664 stores information within the computing device 650. The memory 664 can be implemented as one or more of a computer-readable medium or media, a volatile memory unit or units, or a non-volatile memory unit or units. Expansion memory 674 may also be provided and connected to device 650 through expansion interface 672, which may include, for example, a SIMM (Single In Line Memory Module) card interface. Such expansion memory 674 may provide extra storage space for device 650, or may also store applications or other information for device 650. Specifically, expansion memory 674 may include instructions to carry out or supplement the processes described above, and may include secure information also. Thus, for example, expansion memory 674 may be provided as a security module for device 650, and may be programmed with instructions that permit secure use of device 650. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 664, expansion memory 674, or memory on processor 652, that may be received, for example, over transceiver 668 or external interface 662.

Device 650 may communicate wirelessly through communication interface 666, which may include digital signal processing circuitry where necessary. Communication interface 666 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 668. In addition, short-range communication may occur, such as using a Bluetooth, WiFi, or other such transceiver (not shown). In addition, GPS (Global Positioning System) receiver module 670 may provide additional navigation- and location-related wireless data to device 650, which may be used as appropriate by applications running on device 650.

Device 650 may also communicate audibly using audio codec 660, which may receive spoken information from a user and convert it to usable digital information. Audio codec 660 may likewise generate audible sound for a user, such as through a speaker, e.g., in a handset of device 650. Such sound may include sound from voice telephone calls, may include recorded sound (e.g., voice messages, music files, etc.) and may also include sound generated by applications operating on device 650.

The computing device 650 may be implemented in a number of different forms, as shown in the figure. For example, it may be implemented as a cellular telephone 680. It may also be implemented as part of a smart phone 682, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of embodiments have been described. Nevertheless, it will be understood that various modifications may be made without departing from the spirit and scope of the specification.

It will also be understood that when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A method, comprising:
identifying, by controlling circuitry of a computer, portions of a space-filling curve with a plurality of points in space;
defining, by the controlling circuitry, a sequence for encoding the plurality of points in space according to positions of each of the plurality of points along the space-filling curve; and
generating, by the controlling circuitry, an encoding of the plurality of points as arranged in the sequence.

2. The method as in claim 1, wherein the space-filling curve is a fractal curve.

3. The method as in claim 2, wherein the fractal curve is a Hilbert curve.

4. The method as in claim 1, wherein the plurality of points is contained within a bounding box;
wherein each of the plurality of points is contained within a respective subdivision of a plurality of subdivisions of the bounding box, each of the plurality of subdivisions of the bounding box containing at most one point of the plurality of points; and
wherein the space-filling curve traverses each of the plurality of subdivisions exactly once.

5. The method as in claim 4, wherein a length of a subdivision of the plurality of subdivisions is $2^{(-n)}$ of a length of the bounding box, a portion of the space-filling curve traversing that subdivision having an order equal to n.

6. The method as in claim 1, wherein each point of the plurality of points has, as a coordinate representing a location in space of that point, a string of bits.

7. The method as in claim 6, further comprising:
identifying (i) a first bit from the string of bits of a first point of the plurality of points and (ii) a second bit from the string of bits of a second point of the plurality of points based on the portion of the space-filling curve;
wherein defining the sequence for encoding the plurality of points in space according to the positions of the first point and that point along the space-filling curve includes performing a bitwise comparison of the bit from the first bit and the second bit.

8. The method as in claim 7, wherein the portion of the space-filling curve has an orientation with respect to a coordinate axis; and
wherein the first bit and the second bit are identified based on the orientation of the portion of the space-filling curve.

9. The method as in claim 7, wherein identifying the portion of the space-filling curve with the first point of the plurality of points in space includes identifying an order of the space-filling curve based on the length of the string of bits of the first point; and
wherein the first bit and the second bit are identified based on the order of the portion of the space-filling curve.

10. A computer program product comprising a nontransitive storage medium, the computer program product including code that, when executed by processing circuitry of a computer, causes the processing circuitry to perform a method, the method comprising:
identifying, by controlling circuitry of a computer, portions of a space-filling curve with a plurality of points in space;
defining, by the controlling circuitry, a sequence for encoding the plurality of points in space according to positions of each of the plurality of points along the space-filling curve; and
generating, by the controlling circuitry, an encoding of the plurality of points as arranged in the sequence.

11. The computer program product as in claim 10, wherein the space-filling curve is a fractal curve.

12. The computer program product as in claim 11, wherein the fractal curve is a Hilbert curve.

13. The computer program product as in claim 10, wherein the plurality of points is contained within a bounding box;
wherein each of the plurality of points is contained within a respective subdivision of a plurality of subdivisions of the bounding box, each of the plurality of subdivisions of the bounding box containing at most one point of the plurality of points; and
wherein the space-filling curve traverses each of the plurality of subdivisions exactly once.

14. The computer program product as in claim 13, wherein a length of a subdivision of the plurality of subdivisions is $2^{(-n)}$ of a length of the bounding box, a portion of the space-filling curve traversing that subdivision having an order equal to n.

15. The computer program product as in claim 10, wherein each point of the plurality of points has, as a coordinate representing a location in space of that point, a string of bits.

16. The computer program product as in claim 15, wherein the method further comprises:
identifying (i) a first bit from the string of bits of a first point of the plurality of points and (ii) a second bit from the string of bits of a second point of the plurality of points based on the portion of the space-filling curve;
wherein defining the sequence for encoding the plurality of points in space according to the positions of the first point and that point along the space-filling curve includes performing a bitwise comparison of the bit from the first bit and the second bit.

17. The computer program product as in claim 16, wherein the portion of the space-filling curve has an orientation with respect to a coordinate axis; and
wherein the first bit and the second bit are identified based on the orientation of the portion of the space-filling curve.

18. The method as in claim 16, wherein identifying the portion of the space-filling curve with the first point of the plurality of points in space includes identifying an order of the space-filling curve based on the length of the string of bits of the first point; and
wherein the first bit and the second bit are identified based on the order of the portion of the space-filling curve.

19. An electronic apparatus comprising:
memory; and
controlling circuitry coupled to the memory, the controlling circuitry being configured to:
identify portions of a space-filling curve with a plurality of points in space;
define a sequence for encoding the plurality of points in space according to positions of each of the plurality of points along the space-filling curve; and
generate an encoding of the plurality of points as arranged in the sequence.

20. The electronic apparatus as in claim 19, wherein the plurality of points is contained within a bounding box;

wherein each of the plurality of points is contained within a respective subdivision of a plurality of subdivisions of the bounding box, each of the plurality of subdivisions of the bounding box containing at most one point of the plurality of points; and wherein the space-filling curve traverses each of the plurality of subdivisions exactly once.

\* \* \* \* \*